United States Patent
Fujibayashi et al.

(10) Patent No.: US 8,507,921 B2
(45) Date of Patent: Aug. 13, 2013

(54) SINGLE CRYSTAL COMPOUND SEMICONDUCTOR SUBSTRATE

(75) Inventors: Hiroaki Fujibayashi, Chiryu (JP); Masami Naito, Inazawa (JP); Nobuyuki Ooya, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 13/348,752

(22) Filed: Jan. 12, 2012

(65) Prior Publication Data
US 2012/0181550 A1 Jul. 19, 2012

(30) Foreign Application Priority Data
Jan. 17, 2011 (JP) .................................. 2011-7056

(51) Int. Cl.
*H01L 23/58* (2006.01)
(52) U.S. Cl.
USPC ............... 257/77; 257/11; 257/627; 257/628; 257/798; 257/E21.703; 257/E29.003; 257/E29.004
(58) Field of Classification Search
USPC .................... 257/11, 627, 628, 798, E21.703, 257/E29.003, E29.004, 77
See application file for complete search history.

(56) References Cited

U.S. PATENT DOCUMENTS

| | | | | |
|---|---|---|---|---|
| 4,912,063 A * | 3/1990 | Davis et al. | ...................... | 117/97 |
| 5,011,549 A * | 4/1991 | Kong et al. | .................. | 148/33.1 |
| 5,709,745 A * | 1/1998 | Larkin et al. | ..................... | 117/96 |
| 5,958,132 A * | 9/1999 | Takahashi et al. | ............... | 117/84 |
| 5,972,801 A * | 10/1999 | Lipkin et al. | ................... | 438/770 |
| 6,097,039 A * | 8/2000 | Peters et al. | ...................... | 257/77 |
| 6,097,096 A * | 8/2000 | Gardner et al. | ..................... | 257/777 |
| 6,573,534 B1 * | 6/2003 | Kumar et al. | .................... | 257/77 |
| 6,838,814 B2 * | 1/2005 | Chen | ............................. | 313/495 |
| 6,900,108 B2 * | 5/2005 | Kurtz et al. | .................... | 438/406 |
| 7,256,101 B2 * | 8/2007 | Letertre et al. | ................. | 438/458 |
| 7,449,065 B1 * | 11/2008 | Powell et al. | ..................... | 117/84 |
| 7,741,678 B2 * | 6/2010 | Ghyselen et al. | ............. | 257/347 |
| 8,222,648 B2 * | 7/2012 | Tanimoto et al. | ............... | 257/77 |
| 8,247,887 B1 * | 8/2012 | Raring et al. | ................. | 257/628 |
| 2007/0038518 A1 | 2/2007 | Yokoyama | | |

(Continued)

FOREIGN PATENT DOCUMENTS

| | | |
|---|---|---|
| JP | A-2007-88008 | 4/2007 |
| JP | A-2009-54864 | 3/2009 |
| JP | 2009155201 A * | 7/2009 |

OTHER PUBLICATIONS

Arai, Kazuo, et al. "Basic and Application of SiC Device." *Ohmsha Ltd.* (2003): 89. (with English abstract; described on p. 2 of the specification).

(Continued)

*Primary Examiner* — Ida M Soward
(74) *Attorney, Agent, or Firm* — Posz Law Group, PLC

(57) ABSTRACT

A compound semiconductor substrate includes a first substrate and a second substrate made of single crystal silicon carbide. In each of the first substrate and the second substrate, one surface is a (000-1) C-face and an opposite surface is a (0001) Si-face. The first substrate and the second substrate are bonded to each other in a state where the (0001) Si-face of the first substrate and the (0001) Si-face of the second substrate face each other, and the (000-1) C-face of the first substrate and the (000-1) C-face of the second substrate are exposed.

3 Claims, 7 Drawing Sheets

(56) References Cited

U.S. PATENT DOCUMENTS

| | | | |
|---|---|---|---|
| 2009/0072243 A1 | 3/2009 | Suda et al. | |
| 2010/0081243 A1 | 4/2010 | Kono et al. | |
| 2011/0006309 A1* | 1/2011 | Momose et al. | 257/77 |
| 2011/0006310 A1* | 1/2011 | Nagasawa et al. | 257/77 |
| 2011/0266558 A1* | 11/2011 | Yano | 257/77 |
| 2012/0012862 A1* | 1/2012 | Nishiguchi et al. | 257/77 |
| 2012/0241767 A1* | 9/2012 | Yano et al. | 257/77 |

OTHER PUBLICATIONS

Kwak, Joon Seop et al. "Crystal-polarity dependence of Ti/Al contact to freestanding $n$-GaN substrate." *Applied Physics Letters* 79.20 (2001): 3254-3256. (described on p. 2 of the specification).

Office Action dated Feb. 5, 2013 mailed in corresponding JP Application No. 2011-007056 (with English translation).

* cited by examiner

⟨000-1⟩ C-FACE

⟨0001⟩ Si-FACE

● C ATOM   ○ Si ATOM

⟨000-1⟩ C-FACE

JOINT INTERFACE

⟨000-1⟩ C-FACE

● C ATOM   ○ Si ATOM

US 8,507,921 B2

SINGLE CRYSTAL COMPOUND SEMICONDUCTOR SUBSTRATE

CROSS REFERENCE TO RELATED APPLICATION

The present application is based on and claims priority to Japanese Patent Application No. 2011-7056 filed on Jan. 17, 2011, the contents of which are incorporated in their entirety herein by reference.

TECHNICAL FIELD

The present disclosure relates to a compound semiconductor substrate and a manufacturing method of a compound semiconductor substrate.

BACKGROUND

A power semiconductor device formed in a SiC semiconductor substrate, which has a larger property value than Si, can achieve a greater performance than a power semiconductor device formed in Si. Specifically, because SiC can function as semiconductor to a high temperature due to a wide energy gap (about 3 times wider than Si), SiC can have a high breakdown voltage due to a high dielectric breakdown voltage (about 10 times higher than Si), and SiC has an excellent radiation performance due to high thermal conductivity (about 3 times higher than Si), SiC can achieve higher current.

This kind of SiC semiconductor substrate has polar faces of Si-face ((0001) Si-face) and C-face ((000-1) C-face), and properties depend on the polar faces. Thus, when a device is formed using a SiC semiconductor substrate, a choice of polar face becomes important.

The polar face means a surface which is an ideal surface without defects and on which exposure probabilities of atoms constituting of a compound semiconductor (Si and C in a case of SiC) are not equal to each other. In other words, on a C-face in a SiC semiconductor substrate, mainly C is exposed from a substrate surface and an exposure probability of C is higher than Si, and on a SiC-face, mainly Si is exposed from a substrate surface and an exposure probability of Si is higher than C.

For example, in a case of SiC semiconductor substrate, a C-face has a lower contact resistance than a Si-face (for example, see Patent Document No. 1), and a C-face has a higher thermal oxidation rate than a Si-face (for example, see Patent Document No. 2). Furthermore, in a case where a MOSFET and the like is formed on a C-face, a channel mobility is high (for example, see Nonpatent Document No. 1).

The same as a SiC semiconductor substrate holds true for a gallium nitride (hereafter, referred to as GaN) semiconductor substrate. Specifically, a GaN semiconductor substrate has polar faces of a Ga-face and a N-face. In a GaN semiconductor substrate, it is known that growth on a Ga-face provides a high crystal quality, and it is general to form a device using a Ga-face as a front surface so that a high-quality epitaxial layer can be formed (for example, see Patent Document No. 3). On the other hand, in a GaN semiconductor substrate, a Ga-face has a lower contact resistance than a N-face. Thus, it is preferable that a rear surface is a Ga-face in order to reduce a contact resistance with a rear electrode (for example, see Nonpatent Document No. 2).

CONVENTIONAL ART DOCUMENTS

Patent Documents

Patent Document No. 1: JP-A-2007-020155 (corresponding to US 2007/0038518 A1)
Patent Document No. 2: JP-A-2010-080787 (corresponding to US 2010/0081243 A1)
Patent Document No. 3: JP-A-2007-088008

Nonpatent Documents

Nonpatent Document No. 1: Kazuo Arai and Sadafumi Yoshida, "Basic and Application of SiC Device," Ohmsha, Ltd, Mar. 26, 2003, p 89
Nonpatent Document No. 2: Joon Seop Kwak, et al., "Crystal-polarity dependence of Ti/Al contacts to freestanding n-GaN substrate," APPLIED PHYSICS LETTERS, Nov. 12, 2001, Volume 79, Number 20, pp. 3254-3256

However, in a SiC semiconductor substrate and a GaN semiconductor substrate, a front surface and a rear surface have different polar faces. Thus, in a case where a vertical device is formed, the same polar face cannot be chosen on both of the front surface and the rear surface. Thus, in a case of a SiC semiconductor substrate, when a Si-face is set to a front surface, a C-face has to be a rear surface, and when a C-face is set to a front surface, a Si-face has to be a rear surface. Thus, for example, when a vertical MOSFET is formed using a C-face as a front surface, a drain electrode has to be formed on a Si-face, and a contact resistance becomes high. Similarly, in a GaN semiconductor substrate, when a Ga-face is set to a front surface, a N-face has to be a rear surface, and when a N-face is see to a front surface, a Ga-face is set to a rear surface. In this way, in a conventional compound semiconductor substrate, a preferable polar face can be used on only one of a front surface and a rear surface.

SUMMARY

In view of the foregoing problems, it is an object of the present invention to provide a compound semiconductor substrate in which a predetermined polar face can be used on both of a front surface and a rear surface. Another object of the present invention is to provide a manufacturing method of a compound semiconductor substrate.

A compound semiconductor substrate according to a first aspect of the present disclosure includes a first substrate and a second substrate made of single crystal silicon carbide. In each of the first substrate and the second substrate, one surface is a (000-1) C-face and an opposite surface is a (0001) Si-face. The first substrate and the second substrate are bonded to each other in a state where the (0001) Si-face of the first substrate and the (0001) Si-face of the second substrate face each other, and the (000-1) C-face of the first substrate and the (000-1) C-face of the second substrate are exposed.

In the compound semiconductor substrate according to the first aspect, a predetermined polar face can be used on both of a front surface and a rear surface.

A compound semiconductor substrate according to a second aspect of the present disclosure includes a first substrate and a second substrate made of single crystal gallium nitride. In each of the first substrate and the second substrate, one surface is a (0001) Ga-face and an opposite surface is a (000-1) N-face. The first substrate and the second substrate are bonded to each other in a state where the (000-1) N-face of the first substrate and the (000-1) N-face of the second substrate face each other, and the (0001) Ga-face of the first substrate and the (0001) Ga-face of the second substrate are exposed.

In the compound semiconductor substrate according to the second aspect, a predetermined polar face can be used on both of a front surface and a rear surface.

In a manufacturing method of a compound semiconductor substrate according to a third aspect, a first substrate and a second substrate made of single crystal silicon carbide are prepared. In each of the first substrate and the second substrate, one surface is a (000-1) C-face and an opposite surface is a (0001) Si-face. The first substrate and the second substrate are bonded in a state where the (0001) Si-face of the first substrate and the (0001) Si-face of the second substrate face each other. The first substrate is removed for a predetermined thickness so that an exposed surface of the first substrate and an exposed surface of the second substrate become (000-1) C-faces.

The manufacturing method according to the third aspect can manufacture a compound semiconductor substrate in which a predetermined polar face can be used on both of a front surface and a rear surface.

In a manufacturing method of a compound semiconductor substrate according to a fourth aspect, a first substrate and a second substrate made of single crystal gallium nitride are prepared. In each of the first substrate and the second substrate, one surface is a (0001) Ga-face and an opposite surface is a (000-1) N-face. The first substrate and the second substrate are bonded in a state where the (000-1) N-face of the first substrate and the (000-1) N-face of the second substrate face each other. The first substrate is removed for a predetermined thickness so that an exposed surface of the first substrate and an exposed surface of the second substrate become (0001) Ga-faces.

The manufacturing method according to the third aspect can manufacture a compound semiconductor substrate in which a predetermined polar face can be used on both of a front surface and a rear surface.

BRIEF DESCRIPTION OF THE DRAWINGS

Additional objects and advantages of the present disclosure will be more readily apparent from the following detailed description when taken together with the accompanying drawings. In the drawings.

DETAILED DESCRIPTION (First Embodiment)

A SiC semiconductor substrate according to a first embodiment of the present disclosure will be described with reference to the accompanying drawings. Using the SiC semiconductor device according to the present embodiment, for example, a vertical power MOSFET can be formed.

Figure 1:
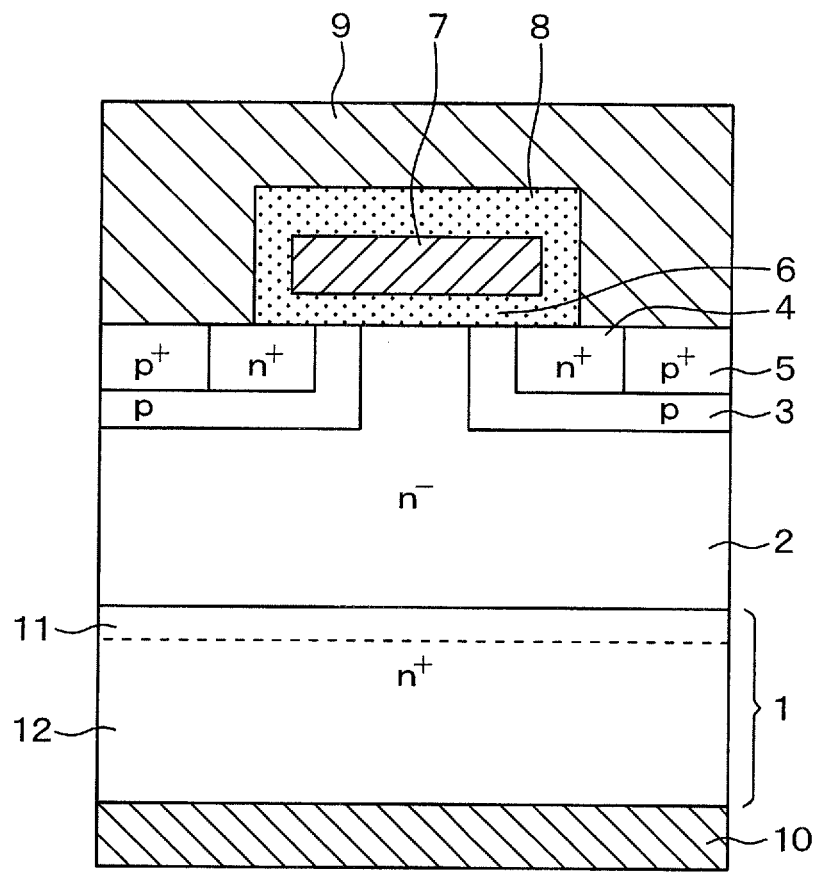
FIG. 1 is a cross-sectional view of a SiC semiconductor device that includes a SiC semiconductor substrate according to a first embodiment of the present disclosure.

As shown in FIG. 1, the vertical power MOSFET is made of $n^+$ type SiC substrate 1. Plane directions of both surfaces of a front surface and a rear surface of the $n^+$ type SiC substrate 1 are (000-1) C-faces. The $n^+$ type SiC substrate 1 has an n type impurity, such as nitrogen, concentration of, for example, $1.0 \times 10^{18}/cm^3$, and has a thickness of about 300 μm. The $n^+$ type SiC substrate 1 is formed by bonding an $n^+$ type SiC substrate 11 and an $n^+$ type SiC substrate 12 in a state where a (0001) Si-face of the $n^+$ type SiC substrate 11 and a (0001) Si-face of the $n^+$ type SiC substrate 12 face each other, and both of exposed surfaces are (000-1) C-faces.

On a surface of the $n^+$ type SiC substrate 1, an $n^-$ type drift layer 2 made of SiC is epitaxially grown. The $n^-$ type drift layer 2 has an n type impurity, such as, nitrogen, concentration of, for example, from $5.0 \times 10^{15}/cm^3$ to $2.0 \times 10^{16}/cm^3$ and has a thickness of from 8 to 15 μm. Because the $n^-$ type drift layer 2 is formed on the surface of the (000-1) C-face of the $n^+$ type SiC substrate 1, a plane direction of the surface of the $n^-$ type drift layer 2 is a (000-1) C-face.

At predetermined region in a surface portion of the $n^-$ type drift layer 2, p type base regions 3 having a predetermined depth are formed so as to be away from each other. In addition, in a surface portion of the p type base region 3, an $n^+$ type source region 4 shallower than the p type base region 3 and having a high impurity concentration is formed. Furthermore, in the surface portion of the p type base region 3, a $p^+$ type contact layer 5 is formed.

The p type base region 3 has a p type impurity, such as boron or aluminum, concentration of, for example, from $5.0 \times 10^{16}$ to $2.0 \times 10^{19}/cm^3$ and has a thickness of about 2.0 μm. The $n^+$ type source region 4 has an n type impurity, such as phosphorous, concentration (surface concentration) of, for example, $1.0 \times 10^{21}/cm^3$ in a surface portion, and has a thickness of about 0.3 μm. The $p^+$ type contact layer 5 has a p type impurity, such as boron or aluminum, concentration (surface concentration) of, for example, $1.0 \times 10^{21}/cm^3$ in a surface portion, and has a thickness of about 0.3 μm. In one cell, two $n^+$ type source regions 4 are disposed opposite each other with a predetermined distance therebetween. The $p^+$ type contact layers 5 are disposed on both sides of the $n^+$ type source regions 4 to sandwich the $n^+$ type source regions 4, which are disposed opposite each other. The p type base region 3 and the $n^+$ type source region 4 are formed by implanting ions into the surface portion of the $n^-$ type drift layer 2 or by epitaxially grown on the $n^-$ type drift layer 2. In each case, the p type base region 3 and the $n^+$ type source region 4 inherit the (000-1) C-face, which is the plane direction of the surface of the $n^+$ type SiC substrate 1, in a manner similar to the $n^-$ type drift layer 2, and plane directions of the surfaces are the (000-1) C-faces.

Furthermore, a gate insulation layer 6 is formed on a surface portion of the $p^-$ type base region 3 between the $n^+$ type source region 4 and the $n^-$ type drift layer 2 and on a surface of the $n^-$ type drift layer 2, and a gate electrode 7 is formed on the gate insulation layer 6. In addition, the gate electrode 7 is covered with an interlayer insulation layer 8, and a source electrode 9 is formed on the interlayer insulation layer 8. The source electrode 9 is electrically coupled with the $n^+$ type source region 4 and the $p^+$ type contact region 5 through a contact hole provided in the interlayer insulation layer 8. On a rear surface of the n⁺ type SiC substrate 1, a drain electrode 10 is formed. The vertical power MOSFET has the above-described configuration.

FIG. 1 shows one cell of the vertical power MOSFET in the SiC semiconductor device. Actually, a plurality of cells having a cross-sectional structure similar to the cross-sectional structure shown in FIG. 1 is continuously arranged to form the SiC semiconductor device.

The SiC semiconductor device including the vertical power MOSFET having the above-described structure is formed using the n⁺ type SiC substrate 1 in which both of the plane directions of the front surface and the rear surface are the (000-1) C-faces. Thus, all of the plane directions of n⁺ type source region 4 and the p⁺ type contact region 5, which are in contact with the source electrode 9, and a contact surface of the n⁺ type SiC substrate 1, which is in contact with the drain electrode 10, are (000-1) C-faces. Thus, compared with a case where one of the surfaces of the n⁺ type SiC substrate 1 is a (0001) Si-face, a contact resistance with the drain electrode 10 can be reduced. In addition, a thermal oxidation rate in a case where the gate insulation layer 6 is formed by thermal oxidation can be high, and channel mobility can also be high.

Next, a manufacturing method of a SiC semiconductor substrate that can be used in manufacture of the SiC semiconductor device having the above-described configuration will be described with reference to FIG. 2A to FIG. 2D.

Figure 2A:
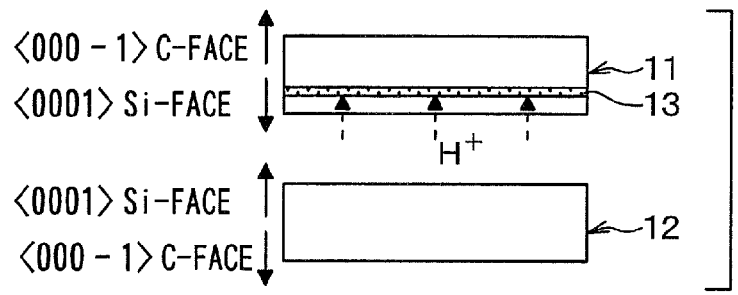
FIG. 2A to FIG. 2D are cross-sectional views showing manufacturing processes of the SiC semiconductor substrate according to the first embodiment.
Figure 3A:
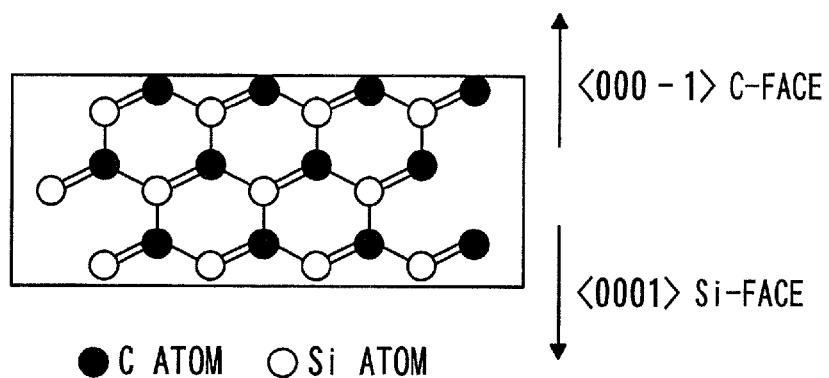
FIG. 3A is a diagram showing a crystal structure of 4H—SiC.

In a process shown in FIG. 2A, the n⁺ type SiC substrates 11, 12 made of single crystal 4H—SiC are prepared. Each of the n⁺ type SiC substrates 11, 12 is high quality and has flat surfaces, and a plane direction of one surface is a (0001) Si-face and a plane direction of the other surface is a (000-1) C-face. As shown in FIG. 3A, 4H—SiC has a hexagonal crystal structure in which Si and C are alternately bonded to form hexagonal shapes. Thus, 4H—SiC has two polar faces. One of the polar faces is a (000-1) C-face in which mainly C atoms are exposed from a substrate surface, and the other is a (0001) Si-face in which mainly Si atoms are exposed from a substrate surface.

As the n⁺ type SiC substrates 11, 12, not only on-substrates in which a plane direction of a front surface and a plane direction of a rear surface are just surfaces of a (0001) Si-face and the (000-1) C-face but also off-substrates having an off-angle with respect to the just surfaces can be used. When off-substrates are used, off-directions and off-angles of the n⁺ type SiC substrate 11 and the n⁺ type SiC substrate 12 may be different from each other.

After the (0001) Si-faces of the n⁺ type SiC substrates 11, 12 are planarized so that surface roughness Ra become less than or equal to 5 nm, a surface treatment with HF is performed. Then, hydrogen ions or rare gas ions are implanted from one of the surfaces of the n⁺ type SiC substrate 11, which is planarized and is treated with HF. For example, hydrogen ions or rare gas ions are implanted from the (0001) Si-face of the n⁺ type SiC substrate with an acceleration energy of 200 keV and a dose amount of $2.0 \times 10^{17}/cm^2$. By performing the ion implantation in such a manner that a hydrogen ion concentration or a rare gas ion concentration becomes maximum at a position of a predetermined depth, a damage layer 13 in which hydrogen ions or rare gas ions and crystal defects are high-densely segregated is formed. The acceleration energy and the dose amount are set based on a required forming depth of the damage layer 13. On the above-described condition, the damage layer 13 can be formed at a depth of about 1.3 μm. After that, the n⁺ type SiC substrate 11 and the n⁺ type SiC substrate 12 are arranged in such a manner that the (0001) Si-face of the n⁺ type SiC substrate 11 and the (0001) Si-face of the n⁺ type SiC substrate 12 face each other.

A cap oxidation layer for preventing a channeling may be formed on the surface of the n⁺ type SiC substrate 11 during the ion implantation and may be removed after the ion implantation.

Figure 2B:
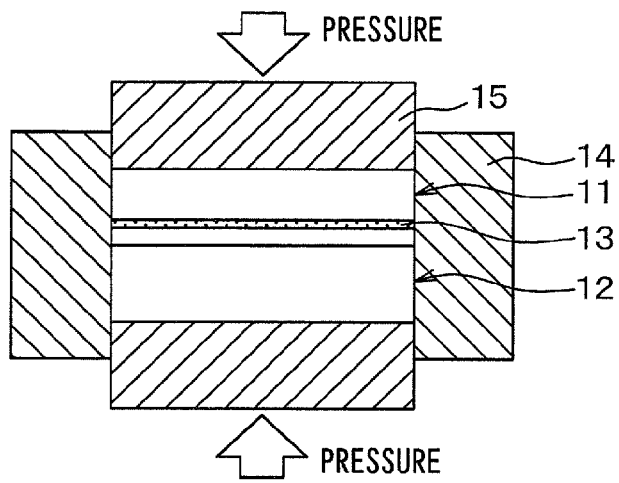

In a process shown in FIG. 2B, a die 14 having a hollow cylindrical shape and made of carbon and a punch 15 having a column shape and having the same diameter as a hollow portion of the die 14 are prepared. Then, the n⁺ type SiC substrate 11 in which the damage layer 13 is formed and the n⁺ type substrate 12 are disposed in the die 14. After that, the punch 15 is arranged on both sides of the n⁺ type SiC substrates 11, 12, and a pressure of 100 kgf/cm² is applied. Accordingly, the (0001) Si-face of the n⁺ type SiC substrate 11 and the (0001) Si-face of the n⁺ type SiC substrate 12 are bonded to each other. If the n⁺ type SiC substrates 11, 12 are heated when the pressure is applied, the n⁺ type SiC substrates 11, 12 are bonded more tightly. Thus, in various processes of forming elements performed in later processes, a detachment at bonded surfaces can be restricted with certainty. However, when both of the bonded surfaces are planarized as the present embodiment, bonding is possible without heating. Thus, a heating process can be omitted, a recombination in the damage layer 13 during the heating process can be restricted, and the n⁺ type SiC substrate 11 can be detached at the damage layer 13 with certainty in a next detaching process.

Figure 2C:
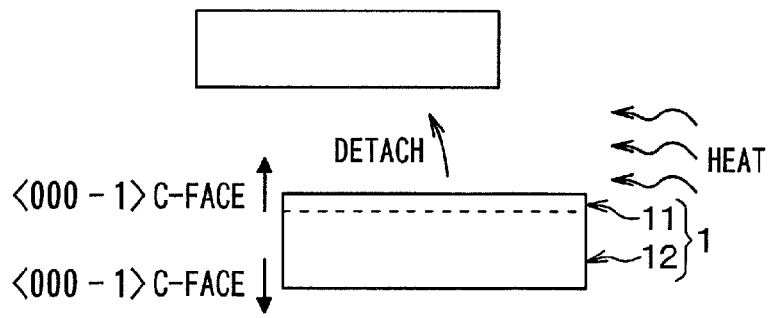

In a process shown in FIG. 2C, the n⁺ type SiC substrates 11, 12 after bonding are removed from a mold including the die 14 and the punch 15. Then, the detaching process in which a portion of the n⁺ type SiC substrate 11 is detached is performed. For example, when the n⁺ type SiC substrates 11, 12 removed from the mold is placed in a heating furnace and a heat treatment is performed in the heating furnace at 900° C. for 30 minutes, the n⁺ type SiC substrate 11 is detached at the damage layer 13 in which crystal defects are generated by implanting hydrogen ions. Accordingly, a thickness of the n⁺ type SiC substrates 11, 12 becomes a desired thickness, and the n⁺ type SiC substrate in which both surfaces are the (000-1) C-faces is completed.

Figure 3B:
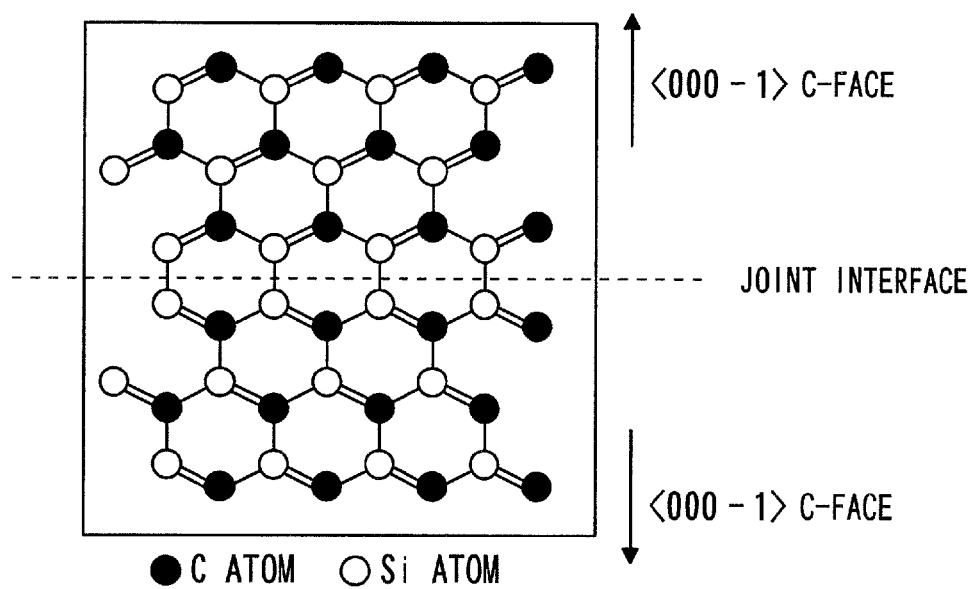
FIG. 3B is a diagram showing a crystal structure of an $n^+$ type SiC substrate after bonding.

Specifically, as shown in FIG. 3B, Si atoms are bonded in a joint interface and C atoms are arranged on exposed surfaces.

Figure 2D:
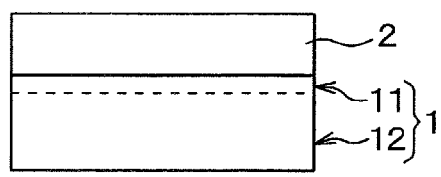

In a process shown in FIG. 2D, on one surface of the n⁺ type SiC substrate 1, the n⁻ type drift layer 2, which works as an active region, is formed by epitaxially growing SiC having a low impurity concentration. At this time, because the n⁻ type drift layer 2 is formed on the surface of the single crystal n⁺ type SiC substrate 1, a crystalline of the n⁻ type drift layer 2 inherits a crystalline of the n⁺ type SiC substrate 1, and a surface of the n⁻ type drift layer 2 is also a (000-1) C-face.

After the n⁻ type drift layer 2 is formed on the n⁺ type SiC substrate 1 through the above-described process, a known device forming process is performed. Accordingly, the vertical power MOSFET shown in FIG. 1 is manufactured. In other words, the p type base region 3 and the n⁺ type source region 4 are formed by ion-implanting impurities to the n⁻ type drift layer 2 using a mask and performing an activation thermal process, and then the gate insulating layer 6 is formed, for example, by thermal oxidation. After that, the gate electrode 7 is formed by forming a layer of doped Poly-Si and patterning. Then, through a forming process of the interlayer insulation layer, a forming process of the contact hole, a patterning process of the source electrode 9 and the gate wiring, and a forming process of the drain electrode 10, the vertical power MOSFET shown in FIG. 1 is completed.

As described above, in the present embodiment, by bonding the (0001) Si-faces of the two n+ type SiC substrates 11, 12, the n+ type SiC substrate 1 whose both surface are (000-1) C-faces can be manufactured. Accordingly, a compound semiconductor substrate, in which a desired polar face can be used both on the front surface and the rear surface, is manufactured.

In addition, by forming a vertical element, such as, a vertical power MOSFET, using the n+ type SIC substrate whose both surfaces are (000-1) C-faces, a high channel mobility can be obtained at a front-surface side of the n+ type SiC substrate 1, and a contact resistance between the drain electrode 10 and the SiC contact surface can be reduced at a rear-surface side.

(Second Embodiment)

A GaN semiconductor substrate according to a second embodiment of the present disclosure will be described. Using the GaN semiconductor substrate according to the present embodiment, for example, a vertical Schottky barrier diode can be formed.

Figure 4:
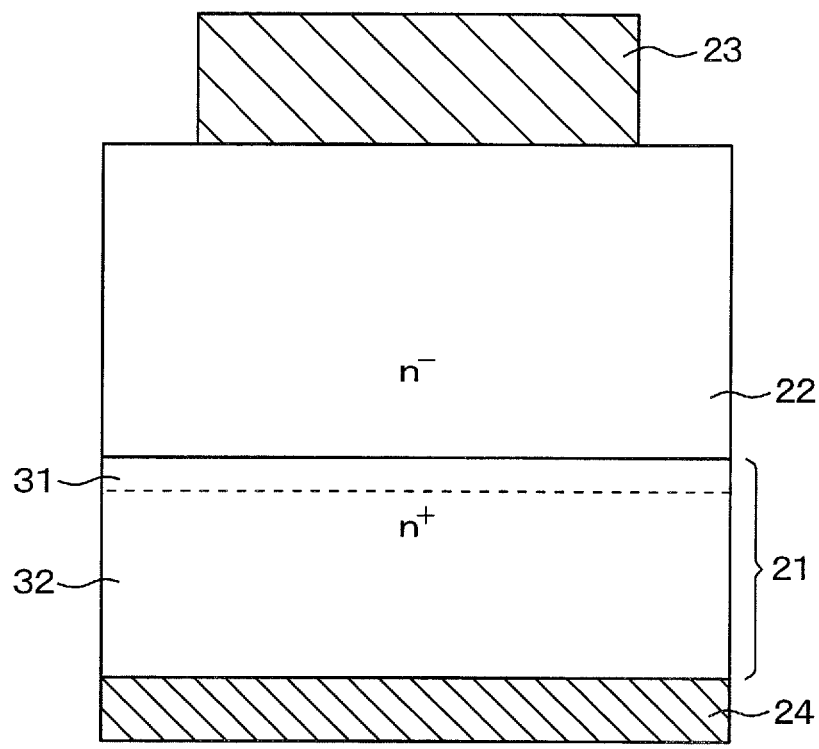
FIG. 4 is a cross-sectional view of a GaN semiconductor device that includes a GaN semiconductor substrate according to a second embodiment of the present disclosure.

As shown in FIG. 4, the vertical Schottky barrier diode is formed using an n+ type GaN substrate 21 as a GaN semiconductor substrate. Both of a front surface and a rear surface of the n+ type GaN substrate 21 are (0001) Ga-faces. In a manner similar to the n+ type SiC substrate 1 described in the first embodiment, the n+ type GaN substrate 21 is formed by bonding two n+ type GaN substrates 31, 32 in a state where a (000-1) N-face of the n+ type GaN substrate 31 and a (000-1) N-face of the n+ type GaN substrate 32 face each other, and both of exposed surfaces are (0001) Ga-faces.

On a surface of the n+ type GaN substrate 21, an n− type epitaxial layer 22 made of GaN is formed. Because the n− type epitaxial layer 22 is formed on the surface of the (0001) Ga-face of the n+ type GaN substrate 21, a plane direction of the surface of the n− type epitaxial layer 22 is a (0001) Ga-face.

On a surface of the n− type epitaxial layer 22, a Schottky electrode 23 made of, for example, Au is formed. On a rear surface of the n+ type GaN substrate 21, a rear electrode 24 made of Ti, which forms an ohmic contact with the rear surface, is formed. The GaN semiconductor device including the vertical Schottky barrier diode has the above-described configuration.

The GaN semiconductor device including the vertical Schottky barrier diode having the above-described configuration is formed using the n+ type GaN substrate 21 in which plane directions of both of the front surface and the rear surface are (0001) Ga-faces. Thus, the n− type epitaxial layer 22 of high crystal quality can be formed at a front-surface side of the n+ type GaN substrate 21, and a contact resistance between the rear electrode 24 and a GaN contact surface can be reduced at a rear-surface side.

Next, a manufacturing method of a GaN semiconductor substrate that is used in manufacture of the GaN semiconductor device having the above-described configuration will be described with reference to FIG. 5A to FIG. 5D. The manufacturing method of the GaN semiconductor substrate according to the present embodiment is almost similar to the manufacturing method of the SiC semiconductor substrate according to the first embodiment. Thus, a different part will be mainly described.

Figure 5A:
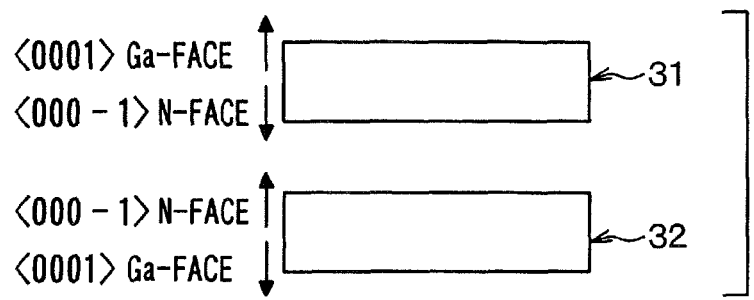
FIG. 5A to FIG. 5D are cross-sectional views showing manufacturing processes of the. GaN semiconductor substrate according to the second embodiment.

In a process shown in FIG. 5A, the two single crystal n+ type GaN substrates 31, 32 are prepared. Each of the n+ type GaN substrates 31, 32 is high quality and has flat surfaces, and a plane direction of one surface is a (0001) Ga-face and a plane direction of the other surface is a (000-1) N-face. Single crystal GaN has two polar faces. One of the polar faces is a (0001) Ga-face in which mainly Ge atoms are exposed from a substrate surface, and the other is a (000-1) N-face in which mainly N atoms are exposed from a substrate surface.

As the n+ type GaN substrates 31, 32, not only on-substrates in which a plane direction of a front surface and a plane direction of a rear surface are just surfaces of a (0001) Ga-face and the (000-1) N-face but also off-substrates having an off-angle with respect to the just surfaces can be used.

After the (000-1) N-faces of the n+ type GaN substrates 31, 32 are planarized so that surface roughness Ra become less than or equal to 5 nm, a surface treatment with HF is performed. Then, the (000-1) N-faces of the two n+ type GaN substrates 31, 32 are arranged so as to face each other.

Figure 5B:
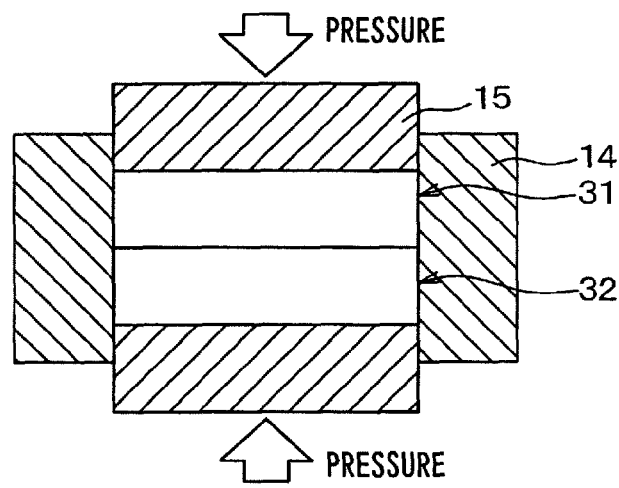

In a process shown in FIG. 5B, a mold including a die 14 and a punch 15 similar to the first embodiment is used. The n+ type GaN substrates 31, 32 are disposed in the mold in a state where the (000-1) N-faces face each other. After that, the punch 15 is arranged on both sides of the n+ type GaN substrates 31, 32, and a pressure of 100 kgf/cm$^2$ is applied. Accordingly, the (0001) N-faces of the n+ type GaN substrates 31, 32 are bonded to each other.

Figure 5C:
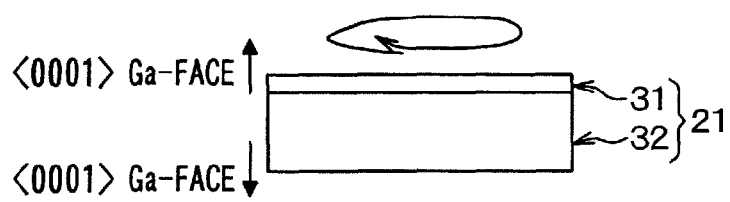

In a process shown in FIG. 5C, the n+ type GaN substrates 31, 32 after bonding are removed from the mold including the die 14 and the punch 15. Then, one of the n+ type GaN substrates 31, 32 is polished so as to have a thickness of about 10 μm. Accordingly, the sum of thicknesses of the n+ type GaN substrates 31, 32 becomes a desired thickness, and the n+ type GaN substrate 21 whose both surfaces are (0001) Ga-faces is completed.

Figure 5D:
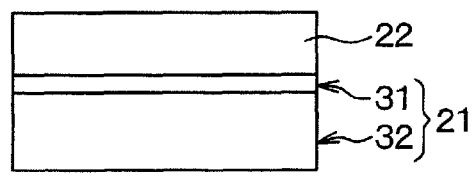

In a process shown in FIG. 5D, on one surface of the n+ type GaN substrate 21 completed as described above, the n− type epitaxial layer 22 is formed by epitaxially growing GaN having a low impurity concentration. At this time, because the n− type epitaxial layer 22 is formed on the surface of the n+ type GaN substrate 21, which is (0001) Ga-face, the n− type epitaxial layer 22 having a high crystal quality can be formed.

After the n− type epitaxial layer 22 is formed on the n+ type GaN substrate 21 through the above-described process, a known device forming process is performed. Accordingly, the vertical Schottky barrier diode shown in FIG. 4 is manufactured. In other words, the Schottky electrode 23 is formed by forming Au layer on the surface of the n− type epitaxial layer 22 and then patterning. Furthermore, the rear electrode 24 made of Ti is formed on the rear surface of the n+ type GaN substrate 21. At this time, because the rear surface of the n+ type GaN substrate 21 is also the (0001) Ga-face, the rear electrode 24 can make the ohmic contact with a low contact resistance with respect to the GaN contact surface. In this way, the vertical Schottky barrier diode shown in FIG. 4 is completed.

As described above, in the present embodiment, by bonding the (000-1) N-faces of the two n+ type GaN substrates 31, 32, the n+ type GaN substrate 21 whose both surfaces are (0001) Ga-faces can be manufactured. Accordingly, a compound semiconductor substrate in which a desired polar face can be used both on the front surface and the rear surface can be formed.

In addition, when a vertical element, such as, a vertical Schottky barrier diode, is formed using the n+ type GaN substrate whose both surfaces are (0001) Ga-face, the n− type epitaxial layer 22 of high crystal quality can be formed on the front-surface side of the n+ type GaN substrate 1, and a contact resistance between the rear electrode 24 and the GaN contact surface can be reduced at a rear-surface side.

(Third Embodiment)

A third embodiment according to the present invention will be described. In the present disclosure, a configuration and a manufacturing method of the n+ type SiC substrate 1 are changed from the first embodiment. Because the others are similar to the first embodiment, only a part different from the first embodiment will be described.

Figure 6:
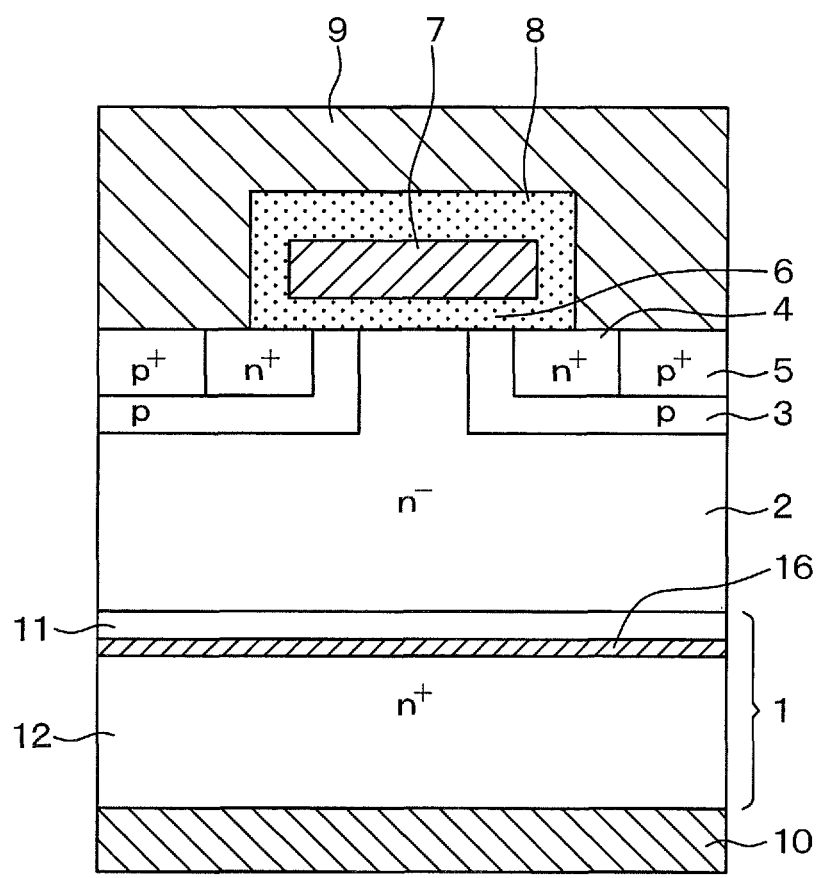
FIG. 6 is a cross-sectional view of a SiC semiconductor device that includes a SiC semiconductor substrate according to a third embodiment of the present disclosure.

As shown in FIG. 6, also in the present embodiment, a vertical power MOSFET having a structure similar to the first embodiment is provided. As the n+ type SiC substrate 1, the n+ type SiC substrate 11 and the n+ type SiC substrate 12 are bonded with a conductive adhesive agent 16 having a high conductivity. The conductive adhesive agent 16 may be made of, for example, carbon adhesive having a volume resistance of $1.0 \times 10^{-2}$ $\Omega \cdot cm$ and has a thickness of, for example, about 1 μm. The other configurations are similar to the first embodiment.

A manufacturing method of the SiC semiconductor device according to the present embodiment will be described with reference to FIG. 7A to FIG. 7D. In a process shown in FIG. 7A, the process shown in FIG. 2A, which has been described in the first embodiment, is performed. Then, in a process shown in FIG. 7B, after the conductive adhesive agent 16 is applied to the (0001) Si-face of one of the n+ type SiC substrates 11, 12, the (0001) Si-faces of the two n+ type SiC substrates 11, 12 are faced each other, and the two n+ type SiC substrates 11, 12 are bonded to each other through the conductive adhesive agent 16.

Figure 7A:
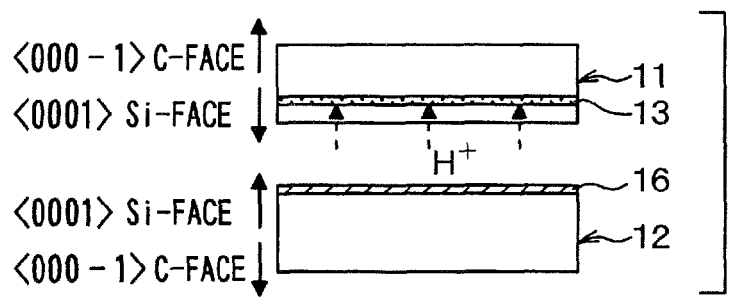
FIG. 7A to FIG. 7D are cross-sectional views showing manufacturing processes of the SiC semiconductor substrate according to the third embodiment.
Figure 7B:
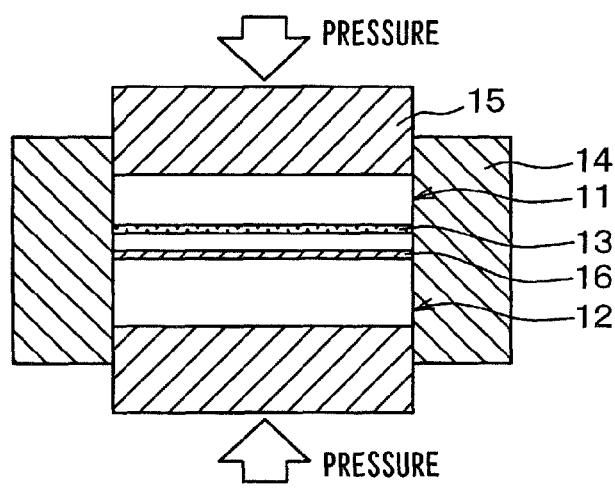
Figure 7C:
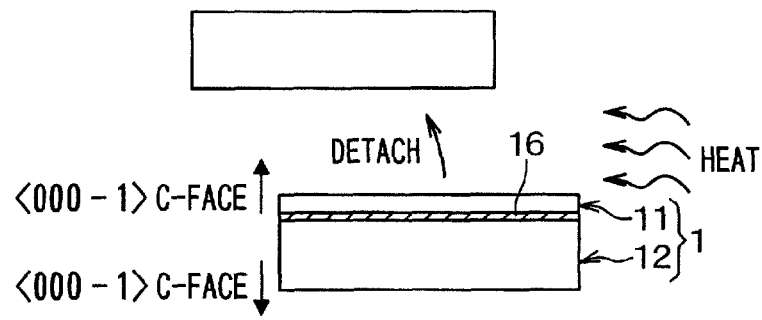
Figure 7D:
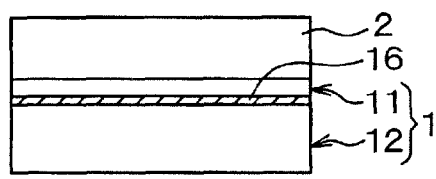

After that, in a process shown in FIG. 7C, the process shown in FIG. 2C, which has been described in the first embodiment, is performed. Accordingly, a portion of the n+ type SiC substrate 11 is detached, and the n+ type SiC substrate having a desired thickness and whose both surfaces are (000-1) C-faces is completed.

In this way, also when the n+ type SiC substrate 11 and the n+ type SiC substrate 12 between which the conductive adhesive agent 16 is arranged is used as the n+ type SiC substrate 1, effects similar to the first embodiment can be achieved.

(Other Embodiments)

In the first and third embodiments, the cases in which the n+ type SiC substrates 11, 12 made of 4H—SiC are used, has been described. However, not limited to 4H—SiC, SiC having other crystal structure may also be used. The crystal structure may also be different. For example, the n+ type SiC substrate 11 may be made of 4H—SiC, and the n+ type SiC substrate 12 may be made of 6H—SiC.

In the first and the third embodiment, the cases in which the vertical power MOSFET is formed in the SiC semiconductor substrate as the vertical semiconductor element has been described. However, other vertical semiconductor element, such as a vertical Schottky barrier diode as described in the second embodiment, may also be formed. In contrast, in the second embodiment, the case in which the vertical Schottky barrier diode is formed in the GaN semiconductor substrate as the vertical semiconductor element has been described. However, other vertical semiconductor element, such as a vertical power MOSFET as described in the first embodiment, may also be formed.

Because the n channel type vertical power MOSFET has been described as an example in the above-described embodiments, the structure in which the n− type drift layer 2 is formed on the n+ type SiC substrate 1 has been described. However, in a case of an n channel type vertical IGBT, a p+ type SiC substrate is used. In this case, a p+ type SiC substrate whose both surfaces are (000-1) C-faces may be manufactured by the above-described manufacturing method.

In the first and third embodiments, the n channel type vertical power MOSFET has been described as an example. However, a p channel type vertical power MOSFET in which a conductivity type of each part is inverted may also be manufactured. It is needless to say that, also other vertical semiconductor element, such as IGBT, can be manufactured using the SiC semiconductor substrate manufactured by the above-described manufacturing method regardless of a conductivity of each of two substrates. In this case, one of the n+ type SiC substrates 11, 12 may be changed to a p+ type SiC substrate, and SiC substrates having different conductivities may be bonded to each other.

In the first and third embodiments, the portion of the n+ type SiC substrate 11 is detached at the damage layer 13 by the heat treatment. The portion of the n+ type GaN substrate 31 can be detached from the damage layer 13 by applying external force. In addition, although the case in which the damage layer 13 is formed in the n+ type SiC substrate 11 and the portion is detached at the damage layer 13 has been described, the detachment of the n+ type GaN substrate 31 as the second embodiment can also be performed by forming a damage layer by implanting hydrogen gas or rare gas ion.

When an orientation of a crystal face is described, it is originally required for attaching a bar above a desired figure. However, the bar is attached before the figure in the present application.

What is claimed is:

1. A compound semiconductor substrate comprising a first substrate and a second substrate made of single crystal silicon carbide, wherein
   in each of the first substrate and the second substrate, one surface is a (000-1) C-face and an opposite surface is a (0001) Si-face, and
   the first substrate and the second substrate are bonded to each other in a state where the (0001) Si-face of the first substrate and the (0001) Si-face of the second substrate face each other, and the (000-1) C-face of the first substrate and the (000-1) C-face of the second substrate are exposed.

2. The compound semiconductor substrate according to claim 1, wherein the first substrate and the second substrate are directly bonded to each other.

3. The compound semiconductor substrate according to claim 1, further comprising a conductive adhesive agent, wherein
   the first substrate and the second substrate are bonded to each other through the conductive adhesive agent.

* * * * *